United States Patent
Hori

(10) Patent No.: US 6,175,114 B1
(45) Date of Patent: Jan. 16, 2001

(54) PYROELECTRIC INFRARED ARRAY SENSOR

(75) Inventor: Kenji Hori, Kyoto (JP)

(73) Assignee: Murata Manufacturing Co., Ltd. (JP)

(*) Notice: Under 35 U.S.C. 154(b), the term of this patent shall be extended for 0 days.

(21) Appl. No.: 09/078,349

(22) Filed: May 13, 1998

Related U.S. Application Data

(63) Continuation-in-part of application No. 08/823,391, filed on Mar. 24, 1997, now abandoned, which is a continuation of application No. 08/329,333, filed on Oct. 26, 1994, now Pat. No. 5,625,188.

(30) Foreign Application Priority Data

Oct. 29, 1993 (JP) .................................................. 5-272219
Dec. 3, 1993 (JP) ...................................................... 5-71171

(51) Int. Cl.⁷ ...................................................... G01J 5/10
(52) U.S. Cl. ...................................... 250/338.3; 250/332
(58) Field of Search ................................. 250/338.3, 332

(56) References Cited

U.S. PATENT DOCUMENTS

| | | | |
|---|---|---|---|
| 3,581,092 | 5/1971 | Pearsall et al. | 250/349 |
| 5,130,542 | 7/1992 | Sibbald et al. | 250/338.3 |

FOREIGN PATENT DOCUMENTS

| | | | |
|---|---|---|---|
| 0345047 | 12/1989 | (EP) . | |
| 2150747 | 7/1985 | (GB) . | |
| 59-159032 | 9/1984 | (JP) | 250/349 |
| 60-69524 | 4/1985 | (JP) | 250/338.3 |
| 61-193030 | 8/1986 | (JP) | 250/338.3 |
| 2-19725 * | 1/1990 | (JP) | 250/338.3 |

* cited by examiner

Primary Examiner—Constantine Hannaher
(74) Attorney, Agent, or Firm—Ostrolenk, Faber, Gerb & Soffen, LLP

(57) ABSTRACT

A pyroelectric infrared array sensor has a pyroelectric element on which a plurality of sensing sections are formed, each of which has upper and lower electrodes which confront each other through the pyroelectric element. To fixedly secure the pyroelectric element to a substrate, lead conductors extended from sensing sections located adjacent to the edges of the light receiving surface of the pyroelectric element are fixedly connected to the substrate by conductive paste. The lower electrodes are connected to solder bumps on the substrate with conductive paste. The respective dimensions of the solder bumps can be adjusted so as to adjust the amount of heat conducted away from the sensing sections and thereby make the heat-sensitivity of the sensing sections more uniform. Alternatively or in addition, the amount of conductive paste used to connect the lower electrodes to the solder bumps can be adjusted for the same purpose.

9 Claims, 8 Drawing Sheets

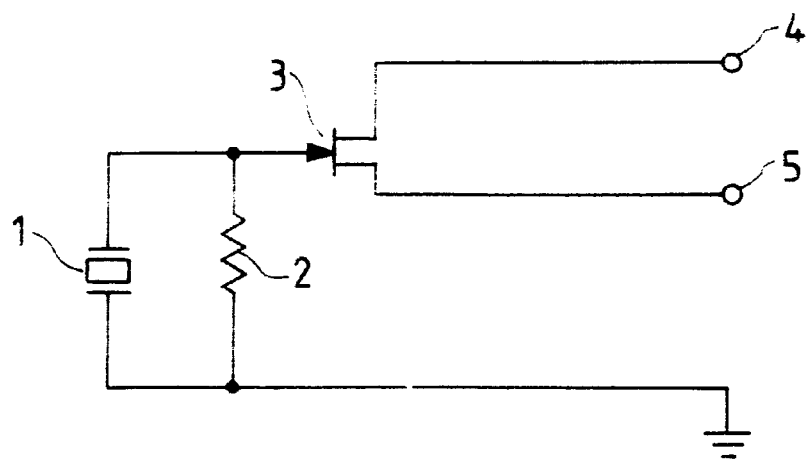
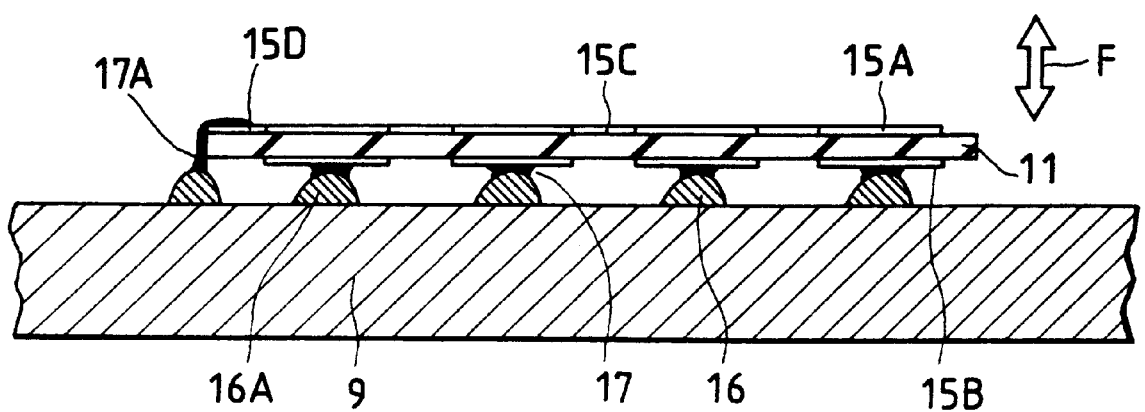

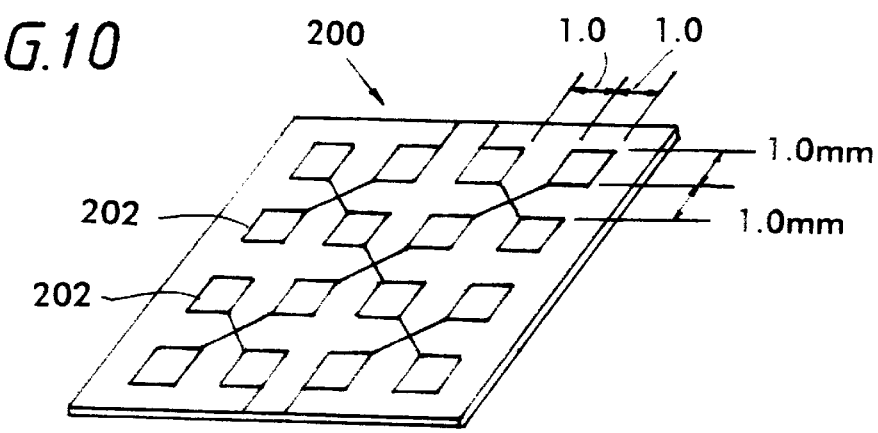
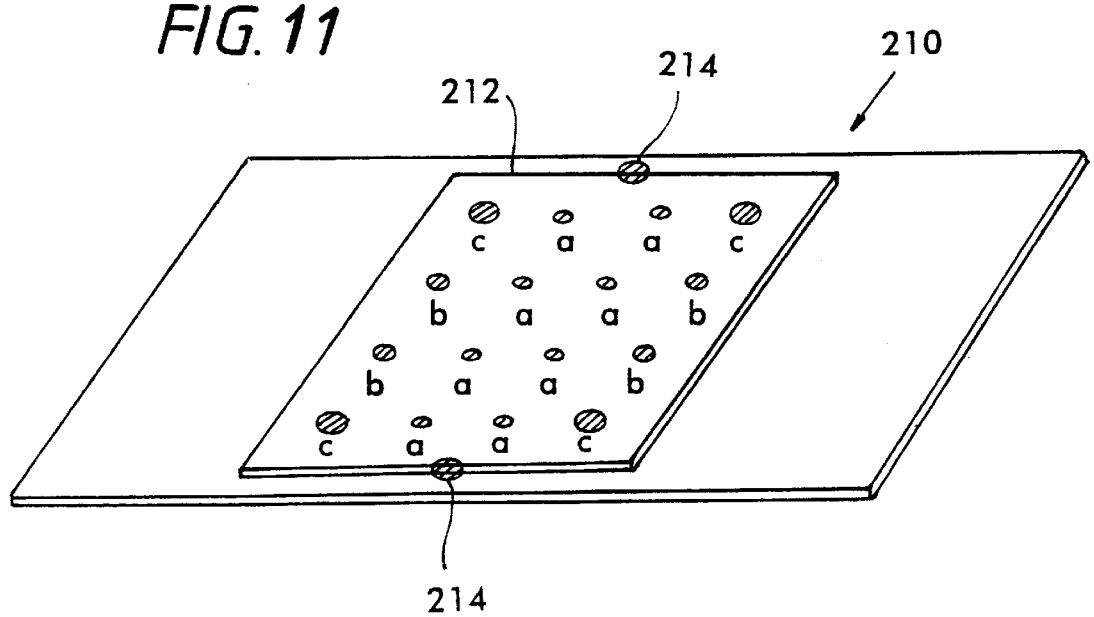

PYROELECTRIC INFRARED ARRAY SENSOR

CROSS-REFERENCE TO RELATED APPLICATION

This is a continuation-in-part of Ser. No. 08/823,391, filed Mar. 24, 1997, now abandoned, which is a continuation of Ser. No. 08/329,333 filed Oct. 26, 1994, now U.S. Pat. No. 5,625,188, the disclosures of which are incorporated by reference herein.

BACKGROUND OF THE INVENTION

1. Field of the Invention

This invention relates to a pyroelectric infrared array sensor which senses infrared rays, for example, from a human body, and generates an alarm signal.

2. Description of the Related Art

A pyroelectric infrared array sensor utilizes a sensing element comprising a material such as PZT (lead zirconate titanate) having a pyroelectric effect. The term "pyroelectric effect" as used herein is intended to mean the characteristic that, when infrared rays are applied to the sensing element, the surface temperature of the latter is changed, as a result of which the charges therein are no longer in the state of neutralization; that is, the element becomes electrically unbalanced, thus producing charges. The charges thus produced can be converted to a voltage by an impedance circuit.

An example of a circuit for use in the pyroelectric infrared array sensor is shown in FIG. 1. A sensing section 1 is formed on a pyroelectric element, and is connected in parallel to a high-resistance chip 2. One of the terminals of the high-resistance chip 2 is connected to the gate terminal G of an FET (field-effect transistor) 3, and the other terminal is grounded. When a positive voltage is applied to a drain terminal pin 4 connected to the drain terminal D of the FET 3, charges produced in response to the application of infrared rays to the sensing section 1 can be detected as a voltage output at a source terminal pin 5 connected to the source terminals of the FET 3.

This characteristic is utilized to provide a pyroelectric infrared linear array sensor in which a plurality of sensing sections are arranged in a line, or a pyroelectric infrared two-dimensional array sensor in which a plurality of sensing sections are arranged two-dimensionally. Those sensors are used for detecting the position or the direction of movement of a person or the like.

FIG. 2 is an exploded perspective view of a conventional pyroelectric infrared array sensor. Terminal pins 6 are embedded in a metal header 8 in such a manner that they penetrate the header 8 through insulating cylindrical pieces 7. A grounding pin (not specifically indicated) is formed by applying conductive paste to the insulating cylindrical piece 7 of a selected one of the terminal pins 6, thereby shorting the terminal pin 6 to the metal header 8, to form the desired grounding pin.

The terminal pins 6 protruding from the upper surface of the metal header 8 are inserted into holes 10 formed in a substrate 9, respectively, and fixedly connected to lands (not shown) which are connected to a circuit (not shown) formed around the holes 10.

A pyroelectric element 11 is mounted via solder bumps 16 on the upper surface of the substrate 9, and high-resistance chips 2 and FETs 3 are mounted on the upper and lower surfaces of the substrate 9. The number of the high-resistance chips 2 and the number of the FETs 3 is equal to the number of the sensing sections.

A casing 12 has an opening 13 which confronts the pyroelectric element 11. The opening 13 is covered by an infrared filter 14.

The metal header 8 is electrically welded to the casing 12, so that the header 8 is electrically connected to the casing 12.

The pyroelectric element 11 is polarized in advance so that its one side is positive, and the other side is negative. The light receiving surface of the pyroelectric element 11 confronts the infrared filter 14 which is perpendicular to the axis of polarization.

As shown in FIG. 3, a plurality of upper electrodes 15A are provided on the light receiving surface of the pyroelectric element 11, and a plurality of lower electrodes 15B are provided on the opposite surface of the element 11 in such a manner that the electrodes 15B confront the electrodes 15A, respectively, through the element 11, thus providing a plurality of sensing sections each including a pair of electrodes 15A and 15B. The electrodes 15A of the sensing sections are connected to one another with connecting conductors 15C. In addition, lead conductors 15D are formed on the element 11. The electrodes 15A, thus connected to each other, are connected to the circuit on the substrate 9 through the lead conductors 15D. The electrodes 15A and 15B, the connecting conductors 15C, and the lead conductors 15D are formed in this example by vapor deposition of NiCr, Ag, Ag—Cu or the like. In the case where the electrodes 15A and 15B are formed of Ag or Ag—Cu, a black film is formed on the surface of each of the electrodes 15A, which absorbs heat with high efficiency.

In order to prevent heat generated at the sensing sections of the pyroelectric element 11 from flowing to the substrate 9, the pyroelectric element 11 is held spaced from the substrate 9; that is, it is secured by the electrodes 15B to solder bumps 16 formed on the circuit on the substrate 9 by using conductive paste 17. Each of the electrodes 15B is connected through the circuit on the substrate 9 to one terminal of the respective high-resistance chip 2 and to the gate terminal of the respective FET 3 (see FIG. 1). The upper electrodes 15A are connected to one another by the connecting conductors 15C, and are fixedly connected through the lead conductors 15D to conductive parts such as the solder bumps 16 on the circuit of the substrate 9 by conductive paste 17A, and are thereby connected to the grounding pin and to the remaining terminals of the high-resistance chips 2 (see FIG. 1). The drain terminals and source terminals of the FETs 3 are connected to predetermined ones of the terminal pins 6.

Charges produced by the plurality of sensing sections of the pyroelectric element 11 are detected as a voltage by a plurality of impedance conversion circuits made up of the FETs 3. By comparing the different outputs of the plurality of sensing sections with one another, the direction of movement or position of a person or the like can be detected.

In the case of a pyroelectric infrared two-dimensional array sensor which includes sixteen (4× 4) sensing sections 18 through 33 as shown in FIGS. 4(a) and 4(b), the sensing sections 18, 21, 30 and 33 at the four corners are each adjacent to two sides of the rectangular pyroelectric element 11, and therefore they are high in thermal resistance. Hence, it is difficult for the heat generated at those sensing sections by infrared rays to diffuse. The sensing sections 19, 20, 22, 25, 26, 29, 31 and 32 are provided along respective sides of the pyroelectric element 11. Therefore, the heat generated at the sensing sections 19, 20, 22, 25, 26, 29, 31 and 32 is more easily diffused than the heat generated in the sensing sections 18, 21, 30 and 33. Hence, the sensing sections 18, 21, 30 and 33 are highest in sensitivity, and the sensing sections 19, 20, 22, 25, 26, 29, 31 and 32 are lower in sensitivity.

The sensitivity of the sensing sections 22 and 26 may be further reduced by thermal conduction through the lead conductors 15D to the conductive parts on the substrate 9 such as the respective solder bumps 16 that are connected to ground.

The conventional pyroelectric infrared two-dimensional array sensor has problems related to these variations in sensitivity. Hence, in application of the sensor, the amplification factors of the amplifier circuits for all the sensing sections must be adjusted; in other words, the adjustment must be carried out for every sensing section, which takes a lot of time and labor, and increases the manufacturing cost of the sensor.

In a pyroelectric infrared linear array sensor as shown in FIGS. 5(a) and 5(b) in which a plurality of sensing sections are arranged one-dimensionally, as in the case of the pyroelectric infrared two-dimensional array sensor, the sensing sections at both ends of the pyroelectric element 11 are highest in sensitivity. The remaining sensing sections become lower in sensitivity towards the middle of the pyroelectric element 11.

Hence, in practice, either the sensing sections at both ends of the pyroelectric element 11 are employed as dummy sensing sections, or they are positioned away from both ends of the element 11, which results in an increase in size of the element 11. Hence, it is impossible to miniaturize the pyroelectric infrared linear array sensor.

Further, the above-described conventional pyroelectric infrared array sensor suffers from the following additional difficulties: In the conventional sensor, referring again to FIG. 3, when the external temperature is changed, the conductive paste 17A is expanded or contracted. In this case, the conductive paste 17A is provided only at one position as described above. Hence, in response to the expansion or contraction of the conductive paste 17A, a great stress is applied to the pyroelectric element 11 in the direction of the arrow F, with the bump 16A closest to the conductive paste 17A acting as a fulcrum as shown in FIG. 3. As a result, the solder bumps 16 of the sensing sections may be cracked at the connecting points or may come off, thus impairing the reliability of the infrared array sensor.

In addition, depending on how the solder bumps are cracked at the connecting points or come off, the electrical conduction between the pyroelectric element 11 and the substrate 9 is deteriorated, which increases noise and lowers the sensitivity of the sensor.

SUMMARY OF THE INVENTION

In view of the foregoing, the present invention provides a pyroelectric infrared array sensor with a plurality of sensing sections having reduced variation in their sensitivity.

The foregoing advantageous feature of the invention has been achieved according to one aspect of the invention by providing a pyroelectric infrared array sensor comprising: a pyroelectric element on which a plurality of sensing sections are provided, each of which is made up of a pair of electrodes which confront each other, each producing charges according to heat generated by infrared rays applied thereto, disposed in a two-dimensional array or a linear array; and a substrate to which the pyroelectric element is fixedly secured; wherein, on the light receiving surface of the pyroelectric element, a plurality of connecting conductors and a plurality of lead conductors are provided in such a manner that the plurality of sensing sections are connected to one another through the connecting conductors, and the lead conductors are extended from symmetrically disposed sensing sections which are located adjacent to edges of the light receiving surface of the pyroelectric element; and the plurality of lead conductors are fixedly connected to the substrate with conductive paste.

According to another aspect of the invention, in the pyroelectric infrared array sensor, a plurality of grounding electrodes are arranged in a two-dimensional array on a grounding electrode forming surface of a pyroelectric element and are conductively connected to one another, and corresponding connecting sections of conductive adhesive agent are provided on the grounding electrode forming surface through which the grounding electrodes are connected to an external ground potential via additional conductive adhesive agent. The plurality of connecting sections of conductive adhesive agent are arranged symmetrically, for example on the front and rear edges, or on the right and left edges, or at both ends of a diagonal of the grounding electrode forming surface of the pyroelectric element.

Since the plurality of connecting sections of conductive adhesive agent are arranged symmetrically on the front and rear edges, or on the right and left edges, or at both ends of a diagonal, for example, of the grounding electrode forming surface of the pyroelectric element, this pyroelectric infrared array sensor solves some of the above-described problems of the prior art. When the connecting sections of conductive adhesive agent are affected by external thermal change, they are all thermally expanded or contracted, more uniformly than in the conventional device. The stresses due to the expansion or contraction of the conductive adhesive agent which are applied to the sensing sections are made substantially uniform, or averaged, because the connecting sections applied with the conductive adhesive agent are arranged symmetrically as described above. That is, although stresses are applied to the connecting points where the grounding electrodes are connected to the solder bumps, those stresses are reduced, which prevents the solder bumps of the sensing sections from being cracked at the connecting points or coming off.

According to a further aspect of the invention, the conductive paste used for fixedly securing the lower electrode of each of the sensing sections to the substrate also serves as a heat sink and a thermal conduction path, which enhances the diffusion of heat generated at the sensing sections by infrared rays applied thereto, and increases the thermal conduction to the substrate. Thus, the heat diffused from and thereby the charges produced by the sensing sections can be made more uniform by adjusting the amount of conductive paste that is used.

According to yet another aspect of the invention, the solder bumps, to which the lower electrodes of the respective sensing sections are connected, themselves serve as a heat sink or thermal conduction path for diffusion of heat generated in the sensing sections. Thus, the heat diffused from the sensing sections, and thereby the charges produced in the sensing sections, can be made more uniform by adjusting the amount of heat-conductive material in the solder bumps themselves. For example, the shapes and/or the dimensions of the solder bumps may be adjusted. Such adjustment may be made instead of, or in addition to, an adjustment to the amount of conductive paste connecting the lower electrodes to the solder bumps according to the previously mentioned aspect of the invention.

Accordingly, in the described sensor, noise is reduced, and sensitivity is improved. Therefore, with the sensor of the invention, a heat source can be detected with high accuracy.

BRIEF DESCRIPTION OF THE DRAWINGS

The accompanying drawings, which are incorporated in and constitute a part of this specification, illustrate embodiments of the invention and, together with the description, serve to explain the features, advantages and principles of the invention. In the drawings, FIG. 1 is a general circuit diagram of a pyroelectric infrared array sensor;

FIG. 3 is a sectional view showing a pyroelectric element mounted on a substrate in the conventional pyroelectric infrared array sensor;

FIG. 10 is a schematic view of a two-dimensional pyroelectric array sensor according to a further embodiment of the invention;

FIG. 11 is a schematic view of a substrate used with the sensor of FIG. 10;

DETAILED DESCRIPTION OF EMBODIMENTS OF THE INVENTION

Figure 2:
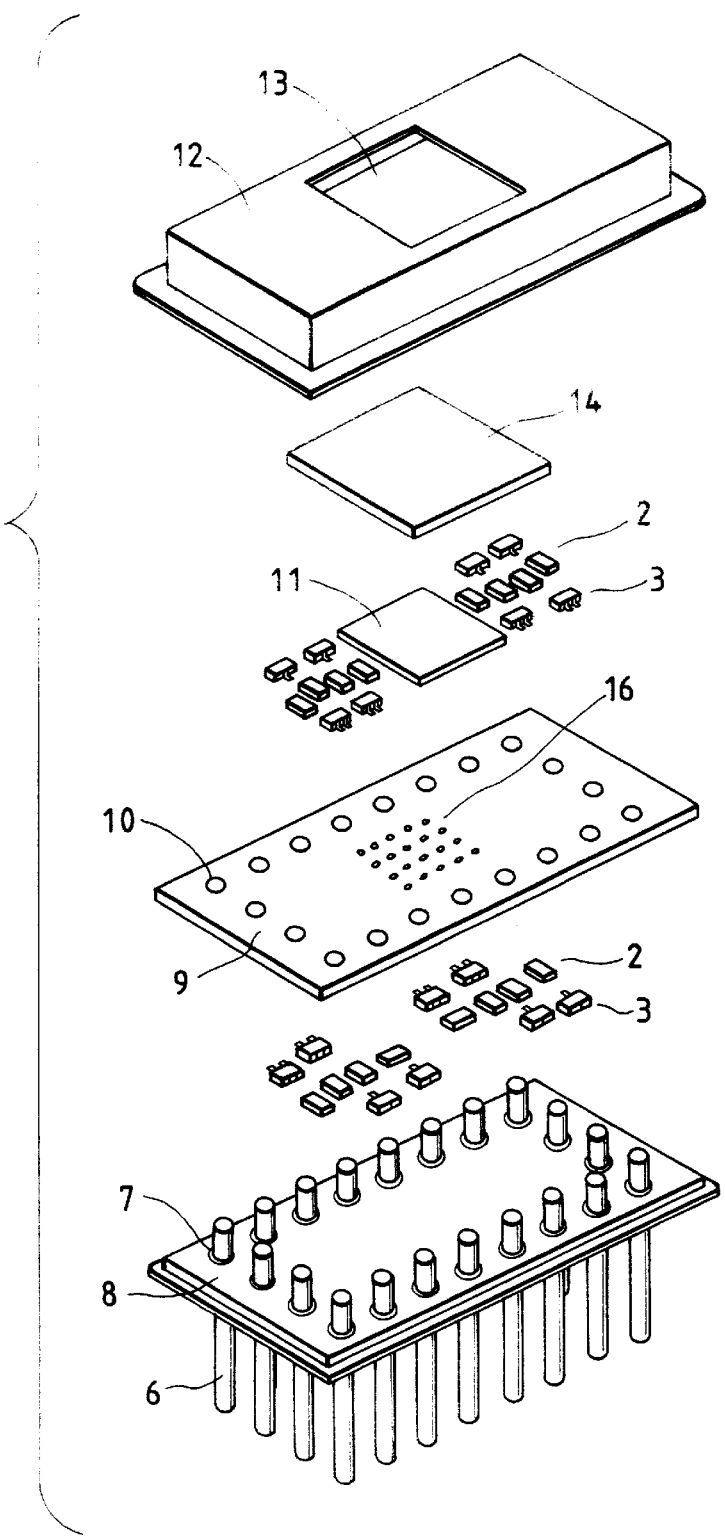
FIG. 2 is an exploded perspective view showing a conventional current collection type infrared array sensor.
Figure 4A:
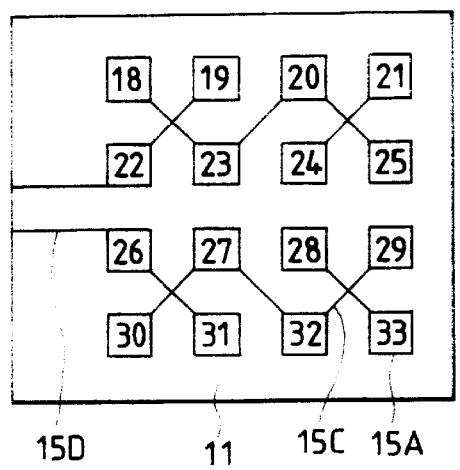
FIGS. 4(a) and 4(b) are respectively a top view and a bottom view showing a pyroelectric element in a conventional current collection type infrared two-dimensional array sensor.
Figure 4B:
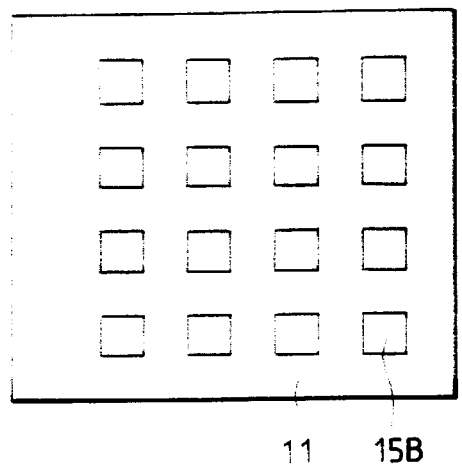
Figure 5A:
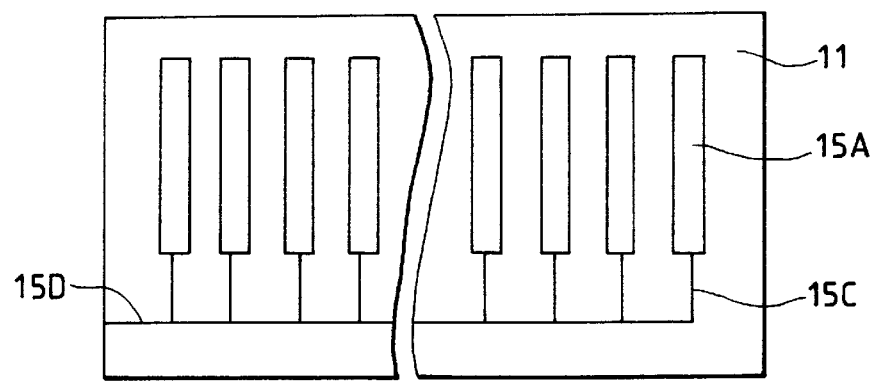
FIGS. 5(a) and 5(b) are respectively a top view and a bottom view showing a pyroelectric element in a conventional pyroelectric infrared linear array sensor.
Figure 5B:
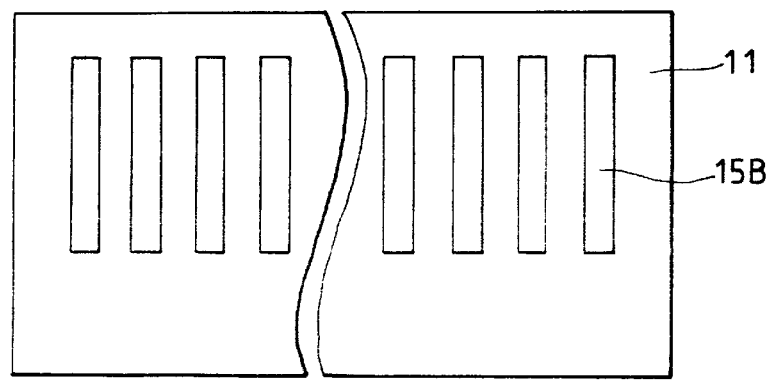
Figure 6A:
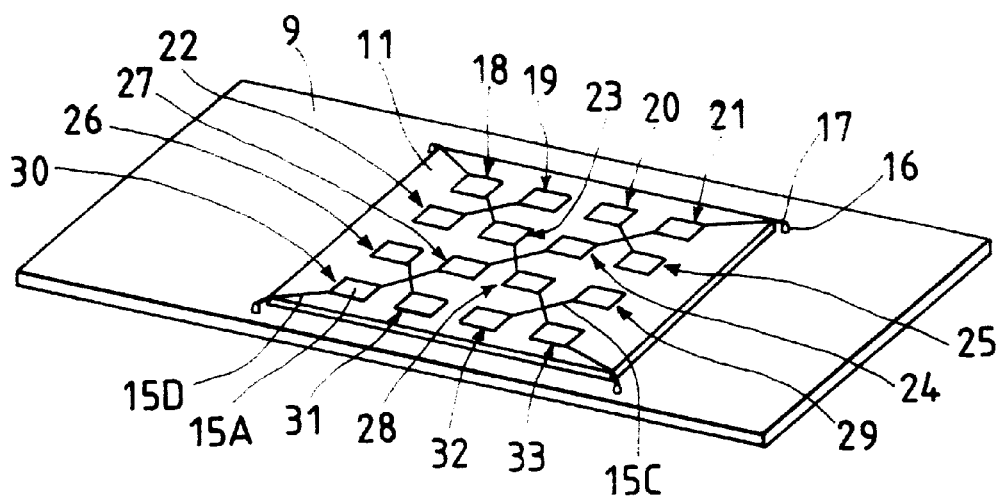
FIGS. 6(a) and 6(b) are respectively a perspective view and a sectional view showing a pyroelectric infrared two-dimensional array sensor in which a pyroelectric element is mounted on a substrate according to a first embodiment of the invention.
Figure 6B:
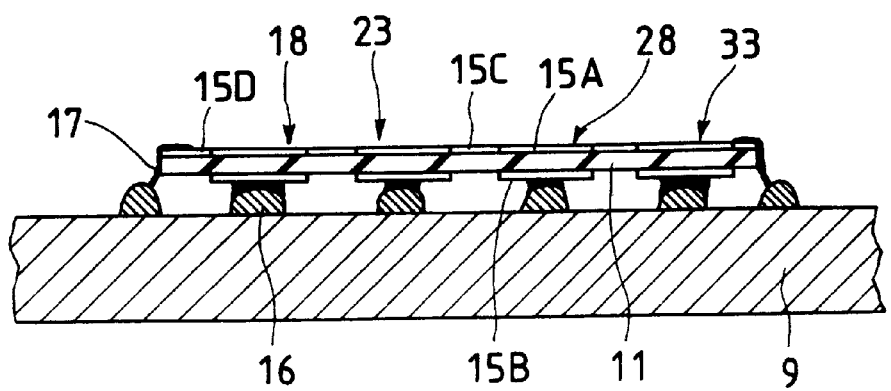

FIGS. 6(a) and 6(b) show a pyroelectric infrared two-dimensional array sensor made up of sixteen (16) sensing sections in accordance with a first embodiment of the invention. The sensor is different from the above-described conventional sensor in its substrate 9 and its pyroelectric element 11. In the pyroelectric element 11, the sensing sections have the same reference numerals as those in the conventional sensor.

As shown in FIGS. 6(a) and 6(b), in the pyroelectric infrared two-dimensional array sensor having sixteen (16) sensing sections 18 to 33, sixteen (16) electrodes 15A are arranged in matrix form, 4×4, at equal intervals on the upper surface of the pyroelectric element 11, and sixteen electrodes 15B are arranged on the lower surface of the element 11 in such a manner that they confront the electrodes 15A through the element 11, respectively. The electrodes 15A of the sensing sections 18, 23, 28 and 33 which are arranged on one of the two diagonal lines of the rectangular pyroelectric element 11, are connected in series with one another by connecting conductors 15C, and similarly the electrodes 15A of the sensing sections 21, 24, 27 and 30 which are arranged on the other diagonal line are connected in series with one another by connecting conductors 15C. The electrodes 15A of the sensing sections 19 and 22 are connected to each other by a connecting conductor 15C which is laid across the connecting conductor 15C which has been laid along the corresponding diagonal line. Similarly, the electrodes 15A of the pairs of sensing sections 20 and 25, 26 and 31, and 29 and 32 are connected to each other by connecting conductors 15C which are laid across the connecting conductors 15C which have been laid along the corresponding diagonal lines, respectively. Those connecting conductors 15C are welded together at the intersections, respectively. Four lead conductors 15D are extended toward the four corners of the pyroelectric element 11 from the electrodes 15A of the four sensing sections 18, 21, 30 and 33 located by the four corners, respectively.

The electrodes 15A and 15B, the connecting conductors 15C, and the lead conductors 15D are formed by vapor deposition of NiCr, Ag, Ag—Cu, or the like. In the case where the electrodes 15A and 15B are made of Ag or Ag—Cu, a black film, which absorbs heat with high efficiency, is formed on the surface of each of the electrodes 15A.

Near the four corners of the pyroelectric element 11, the lead conductors 15D are fixedly connected to conductive parts such as solder bumps 16, which are provided in a circuit (not shown) formed on the substrate 9, by using substantially equal quantities of conductive paste 17.

The electrodes 15B of the sensing sections 18 through 33 are fixedly connected with the conductive paste 17 to the solder bumps 16, which are provided in the circuit on the substrate 9, as follows: To fix each of the electrodes 15B of the corner sensing sections 18, 21, 30 and 33, a relatively large quantity of conductive paste 17 is used; and to fix each of the electrodes 15B of the interior sensing sections 19, 20, 22–25, 26–29, 31 and 32, a smaller quantity of conductive paste 17 is used, than that used to fix the electrodes 15B of the sensing sections 18, 21, 30 and 33.

The conductive paste 17 used for each of the sensing sections 18 to 33 serves as a heat sink for heat generated thereat by infrared rays, and as a heat conduction path to the substrate 9. This improves the diffusion of heat from the corner sensing sections 18, 21, 30 and 33 which was heretofore difficult because of high thermal resistance, and further improves the diffusion of heat from the sensing sections 19, 20, 22–25, 26–29, 31 and 32, although the degree of improvement is smaller than in the case of the corner sensing sections 18, 21, 30 and 33. As a result, the charges produced by the sensing sections 18 through 33 of the pyroelectric element 11 are more uniform; that is, the sensing sections 18 to 33 have less variation in sensitivity.

The conductive paste 17 may be any paste which is conductive, such as conductive silicon, conductive epoxy resin, or conductive phenol resin.

Figure 7A:
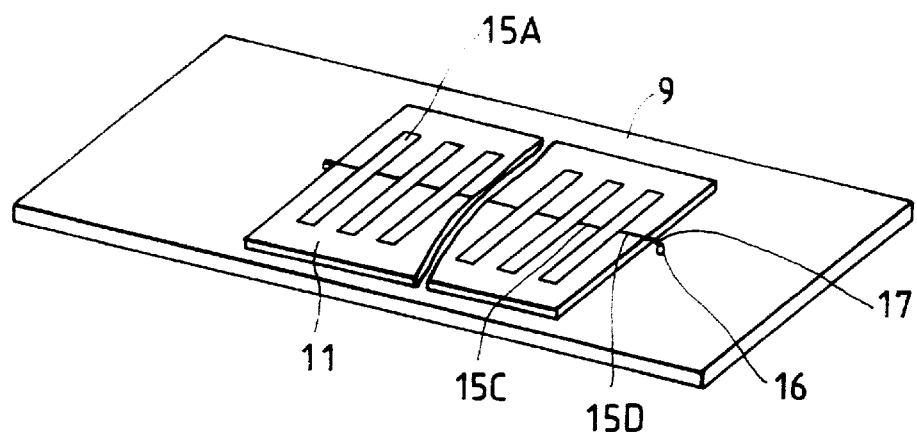
FIGS. 7(a) and 7(b) are respectively a perspective view and a sectional view showing a current collection type infrared linear array sensor in which a pyroelectric element is mounted on a substrate according to a second embodiment of the invention.
Figure 7B:
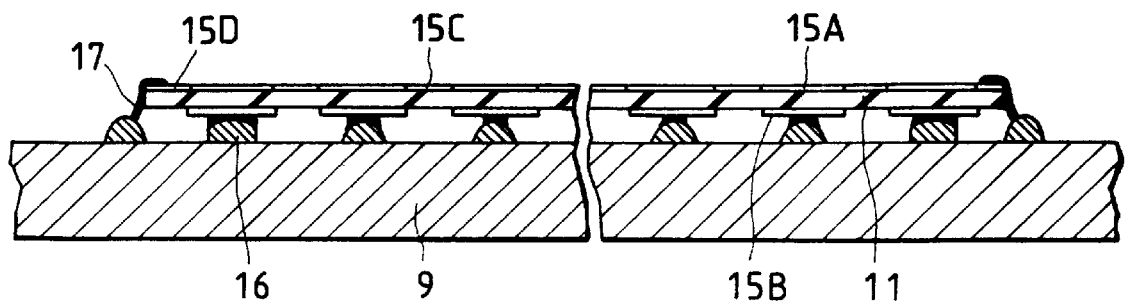

FIGS. 7(a) and 7(b) show a pyroelectric infrared linear array sensor in accordance with a second embodiment. The sensor is different from the above-described conventional sensor in its substrate 9 and its pyroelectric element 11. In the element 11, the sensing sections have the same reference numerals as those in the conventional sensor.

As shown in FIGS. 7(a) and 7(b), in the pyroelectric infrared linear array sensor having a plurality of sensing sections, electrodes 15A are arranged in a line at equal intervals on the upper surface of the pyroelectric element 11, and similarly electrodes 15B are arranged on the lower surface of the pyroelectric element 11 in such a manner that they confront the electrodes 15A, through the element 11, respectively. The electrodes 15A on the upper surface of the element 11 are connected to one another with connecting conductors 15C. Two lead conductors 15D are extended respectively from the electrodes 15A of the two outermost sensing sections to respective ends of the pyroelectric element 11.

The electrodes 15A and 15B, the connecting conductors 15C, and the lead conductors 15D are formed by vapor deposition of NiCr, Ag, Ag—Cu, or the like. In the case where the electrodes 15A and 15B are made of Ag or Ag—Cu, a black film is formed on the surface of each of the electrodes 15A, which absorbs heat with high efficiency.

At the two ends of the pyroelectric element 11, the lead conductors 15D are fixedly connected to conductive parts such as solder bumps 16, which are provided in a circuit (not shown) formed on the substrate 9, by using substantially equal quantities of conductive paste 17.

The electrodes 15B of the sensing sections are fixedly connected to the solder bumps 16 provided in the circuit on the substrate 9, by using conductive paste 17. In this connection, in fixing each of the electrodes 15B of the two outermost sensing sections, a relatively large quantity of conductive paste 17 is used, and in fixing the electrodes 15B of the remaining sensing sections, the quantities of conductive paste 17 used are made smaller towards the middle sensing section, which relatively increases the diffusion of heat from the two outermost sensing sections of the pyroelectric element 11.

The quantities of conductive paste 17 serve as heat sinks for heat generated at the sensing sections by infrared rays, and as heat conduction paths to the substrate 9. This improves the diffusion of heat from the two outermost sensing sections of the pyroelectric element 11 which was heretofore difficult because of high thermal resistance. As a result, the charges produced by all the sensing sections of the pyroelectric element 11 are more uniform; that is, the plurality of sensing sections are less variable in sensitivity.

The conductive paste 17 may be any paste which is conductive, such as conductive silicon, conductive epoxy resin, or conductive phenol resin.

The pyroelectric infrared array sensor of the invention designed as described above has the following effects or merits:

The pyroelectric element, on which a plurality of sensing sections are formed, each of which is made up of a pair of electrodes which confront each other, is fixedly secured to the substrate by using a symmetrical arrangement of quantities of conductive paste. The conductive paste is thus used as a heat sink and a thermal conduction path to the substrate, which enhances the diffusion of heat generated at the sensing sections by infrared rays applied thereto, which heretofore was difficult. Hence, the charges produced by the plurality of sensing sections can be made uniform; that is, they are less variable in sensitivity.

The pyroelectric infrared two-dimensional array sensor is free from the difficulty accompanying the conventional two-dimensional array sensor, in which it is necessary to adjust the amplification factor of each amplifier circuit with respect to the sensitivity of the corresponding sensing section. Hence, the inventive sensor has fewer manufacturing steps, and accordingly is lower in manufacturing cost.

In the pyroelectric infrared linear array sensor, it is unnecessary to provide the dummy sensing sections at the ends, which makes it possible to reduce the size of the pyroelectric element, and the size of the sensor, accordingly.

FIGS. 10–13 illustrate further embodiments of the invention, which utilize the fact that the solder bumps, to which the lower electrodes of the respective sensing sections are connected, themselves serve as a heat sink or thermal conduction path for diffusion of heat generated in the sensing sections. Thus, the heat diffused from the sensing sections, and thereby the charges produced in the sensing sections, can be made more uniform by adjusting the amount of heat-conductive material in the solder bumps themselves. For example, the shapes and/or the dimensions of the solder bumps may be adjusted. Such adjustment may be made instead of, or in addition to, an adjustment to the amount of conductive paste connecting the lower electrodes to the solder bumps according to the other embodiments of the invention.

Figure 8A:
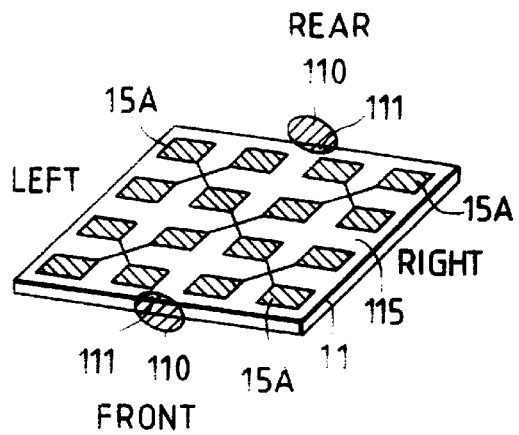
FIGS. 8(a) to 8(d) are respectively perspective views showing examples of pyroelectric elements according to a third embodiment of the invention.

FIG. 10 is a schematic view showing a two-dimensional array sensor 200 having sixteen sensing sections 202 arranged in a symmetrical 4×4 arrangement, similar to that in FIG. 8(a). In this example, each sensing section is 1 mm square and they are spaced 1 mm apart.

FIG. 11 schematically shows a substrate 210 having thereon a two-dimensional array of solder bumps 212 which includes sixteen solder bumps, each being designated a, b or c. Grounding conductive paste bodies 214 are shown schematically at the front and back of the array 212 as seen in FIG. 11.

In this example, the solder bumps a, b and c are generally round and have diameters of 0.3 mm, 0.4 mm, and 0.5 mm, respectively.

The solder bumps c are disposed at the corners of the substrate at locations corresponding to the corners of the sensor 200 where the sensing sections 202 have their greatest sensitivity, to enhance conduction of heat away from these sensing sections. The solder bumps b are disposed at locations corresponding to the left and right sides of the sensor 200 where the sensing sections 202 have an intermediate degree of sensitivity. The solder bumps a are disposed at locations in the array 212 corresponding to interior portions of the sensor 200 where the sensing sections 202 have their lowest sensitivity. Since the amount of heat-conductive material in the solder bumps corresponding to the interior portions of the sensor 200 is decreased, the sensitivity of the sensing sections in the interior portion is enhanced.

The solder bumps a are also disposed at locations along the front and back sides of the array 212 as shown in FIG. 11, to compensate for the conduction of heat away from the respective sensing sections 202 which are connected to the grounding conductive paste bodies 214.

As another example, not illustrated, the solder bumps could be formed with a generally square horizontal cross-section, the solder bumps a, b, and c being respectively 0.3 mm, 0.4 mm and 0.5 mm on a side.

Figure 12:
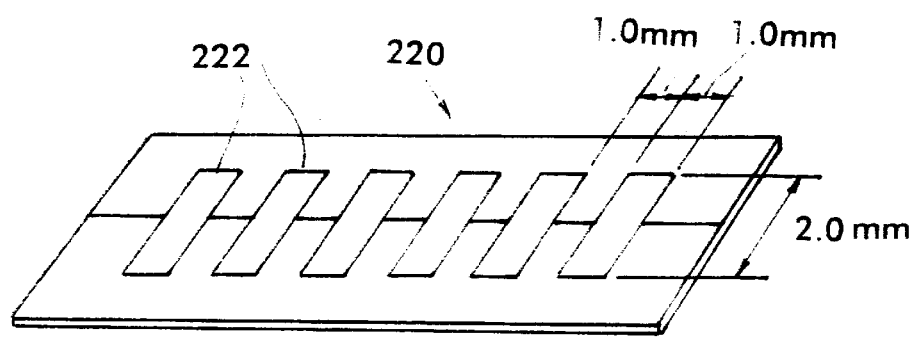
FIG. 12 is a schematic view of a linear pyroelectric array sensor according to yet another embodiment of the invention.

FIG. 12 is a schematic view showing a linear array sensor 220 having six sensing sections 222 arranged in a row. In this example, each sensing section is 1 mm by 2 mm and they are spaced 1 mm apart.

Figure 13:
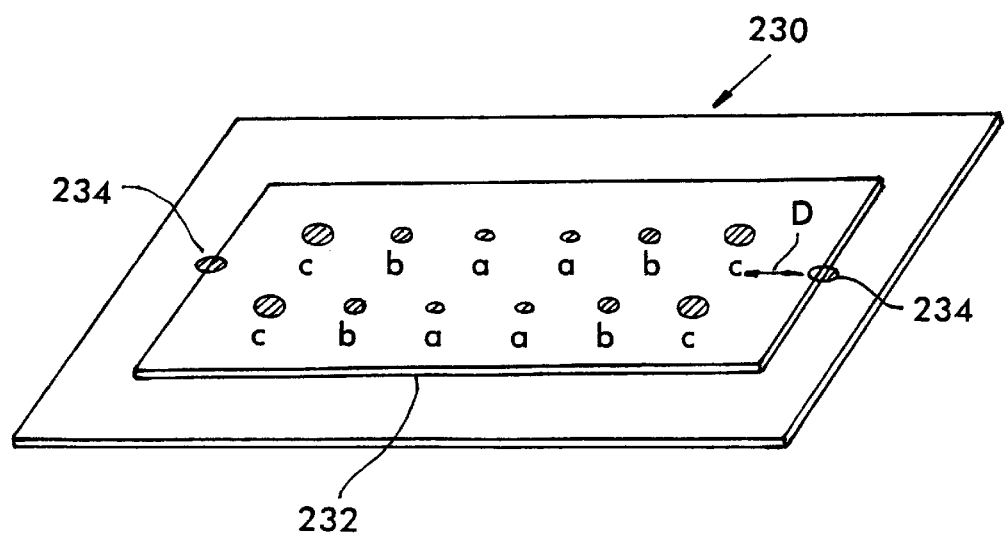
FIG. 13 is a schematic view of a substrate used with the sensor of FIG. 12.

FIG. 13 schematically shows a substrate 230 having thereon a two-dimensional array of solder bumps 232 which includes twelve solder bumps, each being designated a, b or c. Each sensing section 222 in FIG. 12 corresponds to a respective pair of solder bumps in FIG. 13. Grounding conductive paste bodies 234 are shown schematically at the ends of the array 232 as seen in FIG. 13.

In this example, the solder bumps a, b and c are generally round and have diameters of 0.3 mm, 0.4 mm, and 0.5 mm, respectively.

The solder bumps c are disposed at the ends of the substrate 230 at locations corresponding to the ends of the sensor 220 where the sensing sections 222 have their greatest sensitivity. The solder bumps b are disposed at intermediate locations where the sensing sections 222 have an intermediate degree of sensitivity. The solder bumps a are disposed at locations near the middle of the array 232 corresponding to a middle portion of the sensor 220 where the sensing sections 222 have their lowest sensitivity.

In these examples, the amount of heat-conductive material in the solder bumps corresponding to the middle portion of the sensor 220 is decreased, so as to enhance the sensitivity of the sensing sections in the middle portion.

As another example, not illustrated, the solder bumps could be formed with a generally square horizontal cross-section, the solder bumps a, b, and c being respectively 0.3 mm, 0.4 mm and 0.5 mm on a side.

It should be noted that in the example of FIG. 13, the solder bumps c are spaced a substantial distance D from the grounding conductive paste bodies 234, so that the grounding conductive paste bodies 234 do not substantially reduce the sensitivity of the sensing sections at the ends of the linear array sensor 220. Therefore, the solder bumps c can be used and it is not necessary to use the smaller solder bumps b or a.

FIGS. 8(a) to 8(d) show the arrangement of components of a pyroelectric element in a pyroelectric infrared array sensor in accordance with a third embodiment of the invention.

In the sensor according to the third embodiment of the invention, a plurality of grounding electrodes 15A are arranged in a matrix form, or in a two-dimensional array, on the pyroelectric element 11, and are connected to a ground potential electrode on a substrate as in the first embodiment. For this purpose, a conductive adhesive agent 110 is used to connect connecting sections 111 made of conductive adhesive agent to solder bumps 16 which in turn are connected to the ground potential electrode.

A specific feature of this embodiment resides in that the connecting sections 111 are arranged symmetrically at least on the front and rear edges, on the right and left edges, or at both ends of one or both of the diagonal lines of the grounding electrode forming surface 115 of the pyroelectric element 11.

FIGS. 8(a) to 8(d) show examples of the pyroelectric element of the infrared array sensor according to the third embodiment. In the pyroelectric element 11, a plurality of grounding electrodes 15A (sixteen grounding electrodes in FIGS. 8(a) to 8(d)) are formed in a two-dimensional array on the grounding electrode forming surface 115 of the pyroelectric element 11, thus providing sixteen sensing sections. In the pyroelectric element 11, as in the conventional one, the grounding electrodes 15A are connected to the ground potential on the substrate 9. For simplification in description, the description of the conductive connection of the substrate 9 will be omitted.

In the pyroelectric element shown in FIG. 8(a), two connecting sections 111 of conductive adhesive agent are provided symmetrically on the front and rear edges of the grounding electrode forming surface 115 of the pyroelectric element 11, respectively. The grounding electrodes 15A are connected to respective solder bumps 16 and thereby to the ground potential on the substrate 9 by applying additional conductive adhesive agent 110 to the connecting sections 111.

Figure 8B:
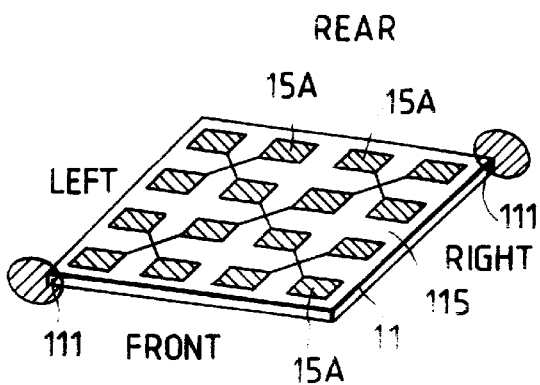

In the pyroelectric element shown in FIG. 8(b), two connecting sections 111 of conductive adhesive agent are arranged symmetrically at both ends of one diagonal line of the grounding electrode forming surface 115 of the pyroelectric element 11, respectively.

Figure 8C:
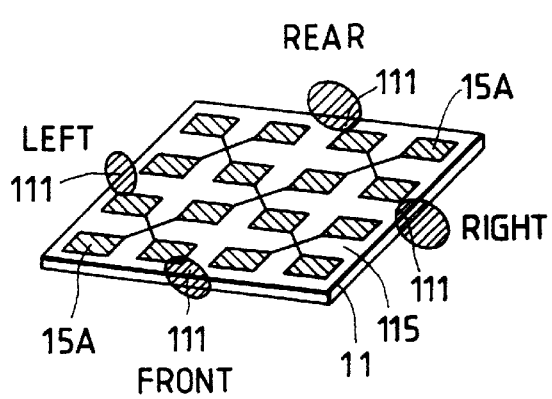

In the pyroelectric element shown in FIG. 8(c), two connecting sections 111 of conductive adhesive agent are provided symmetrically on the front and rear edges of the grounding electrode forming surface 115 of the pyroelectric element 11, respectively, and another two connecting sections 111 of conductive adhesive agent are provided symmetrically on the right and left edges of the grounding electrode forming surface 115 which are perpendicular to the front and rear edges, respectively.

Figure 8D:
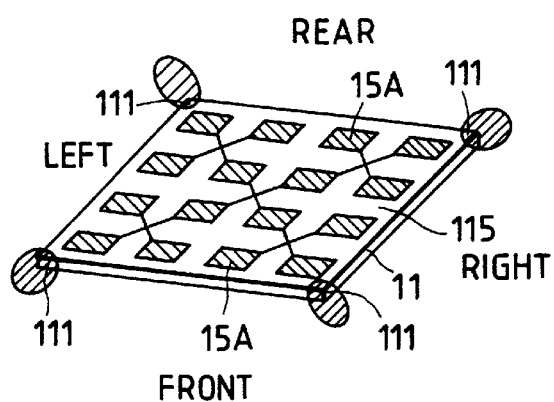

In the pyroelectric element shown in FIG. 8(d), two connecting sections 111 of conductive adhesive agent are provided symmetrically at both ends of one diagonal line of the grounding electrode forming surface 115 of the pyroelectric element 11, respectively; and another two connecting sections 111 of conductive adhesive agent are provided symmetrically at both ends of the other diagonal line of the grounding electrode forming surface 115, respectively.

In the third embodiment, the connecting sections 111 of conductive adhesive agent are arranged symmetrically at least on the front and rear edges, on the right and left edges, or at both ends of one or both of the diagonal lines of the grounding electrode forming surface 115 of the pyroelectric element 11, and the conductive adhesive agent 110 is applied to the connecting sections 111 thus arranged. When the temperature of the conductive adhesive agent 110 is affected by an external thermal change, it is expanded or contracted. However, the stresses due to the expansion or contraction of the conductive adhesive agent 110 which are applied to connecting points of the solder bumps 16 corresponding to the sensing sections are reduced and may be made substantially uniform because the connecting sections applied with the conductive adhesive agent are arranged symmetrically. This eliminates the difficulty accompanying the conventional infrared array sensor that the solder bumps of the sensing sections are cracked at the connecting points or come off, thus improving the reliability of the sensor, and making the electrical connection between the pyroelectric element and the substrate more stable. Therefore, in the sensor, noise is not increased, and sensitivity is improved.

While embodiments of the invention have been described, those skilled in the art may make various changes and modifications therein without departing from the fair spirit and scope of the invention.

Figure 9:
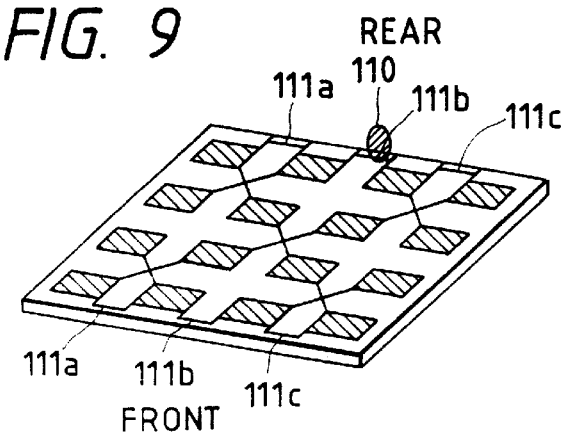
FIG. 9 is a perspective view showing a pyroelectric element according to a modification of the third embodiment of the invention.

For example, in the above-described embodiments, two connecting sections 111 of conductive adhesive agent are arranged symmetrically on the front and rear edges, or on the right and left edges, or at both ends of one diagonal line of the grounding electrode forming surface 115 of the pyroelectric element, respectively; or four connecting sections are arranged symmetrically on the front, rear, right and left edges, or at the four ends of the two diagonal lines of the grounding electrode forming surface 115, respectively. However, as shown in FIG. 9, a plurality of connecting sections 111a, 111b, and 111c of conductive adhesive agent may be provided at symmetrical positions on each of the front and rear edges of the grounding electrode forming surface 115; that is, the number of connecting sections 111 arranged symmetrically on one given edge is not limited. In FIG. 9, only the connecting section 111b on the rear edge is shown literally, and the others are shown schematically. In this case, the stresses applied to the picture elements are further averaged, which further improves the reliability of the connection to the solder bumps.

Furthermore, in the above-described embodiment, the pyroelectric element is formed by arranging sixteen (16=4× 4) picture elements in matrix form (two-dimensional array) on the pyroelectric element; however, the number of picture elements is not limited thereto or thereby. That is, the number of picture elements may be at least two which are arranged one-dimensionally; or may for example be twenty-five (25=5×5) which are arranged two-dimensionally. Further, the two-dimensional array need not be square as shown, but may have a rectangular or other type of shape.

Moreover, in the above-described embodiment, the base material of the conductive adhesive agent 110 is epoxy resin, phenol resin or silicon resin; however, it may be acrylic resin, for example; that is, it may be any base material which forms the conductive adhesive agent 110.

In the pyroelectric infrared array sensor of the disclosed embodiments, a plurality of connecting sections of conductive adhesive agent are arranged symmetrically at least on the front and rear edges, or on the right and left edges, or at both ends of a diagonal line or both diagonal lines of the grounding electrode forming surface of the pyroelectric element. When the connecting sections of conductive adhesive agent are affected by external thermal change, they are thermally expanded or contracted. With the invention, when the pyroelectric sensing sections are connected through the solder bumps to the substrate by the conductive adhesive agent, the stresses due to the expansion or contraction of the conductive adhesive agent which are applied to the connecting points of the solder bumps of the sensing sections are reduced and made substantially uniform, because the connecting sections applied with the conductive adhesive agent are arranged symmetrically as was described above. Thus, the pyroelectric infrared array sensor of the invention is free from the difficulties accompanying the conventional one, namely that the solder bumps of the sensing sections may be cracked at the connecting points or come off. That is, the sensor of the invention is high in reliability.

In the sensor of the invention, the stresses due to the expansion or contraction of the conductive adhesive agent are reduced and uniformly applied to the connecting points of the solder bumps of the sensing sections, which prevents the solder bumps of the sensing sections from being cracked at the connecting points or coming off; that is, the conduction between the pyroelectric element and the substrate is maintained at all times. Accordingly, in the sensor of the invention, noise is not increased, and its sensitivity is not lowered.

The foregoing description of embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A pyroelectric infrared array sensor, comprising:
    a pyroelectric element including a plurality of sensing sections each having an upper electrode and a lower electrode which confront each other through said pyroelectric element, for producing charges in response to heat generated by infrared rays applied thereto, said pyroelectric element having a light receiving surface;
    a substrate to which said pyroelectric element is fixedly secured, said substrate having a plurality of solder bumps which correspond to respective ones of said sensing sections;
    said solder bumps being connected to the lower electrodes of said respective sensing sections; and
    said solder bumps having a relatively large size at an outer portion of said substrate and having a relatively small size at an inner portion of said substrate.

2. A pyroelectric infrared array sensor as claimed in claim 1, wherein said plurality of sensing sections are arranged in a linear array on said pyroelectric element, the solder bumps having said relatively large size at portions of said substrate corresponding to ends of said linear array.

3. A pyroelectric infrared array sensor as claimed in claim 2, wherein said solder bumps are generally round.

4. A pyroelectric infrared array sensor as claimed in claim 2, wherein each of said sensing sections corresponds to a respective plurality of solder bumps disposed on said substrate.

5. A pyroelectric infrared array sensor as claimed in claim 4, wherein each sensing section is connected to a corresponding pair of solder bumps disposed on said substrate.

6. A pyroelectric infrared array sensor as claimed in claim 2, wherein said solder bumps have said relatively small size adjacent to a middle of said linear array, and have an intermediate size between said middle and said ends of said linear array.

7. A pyroelectric infrared array sensor as claimed in claim 1, wherein said plurality of sensing sections are arranged in a two-dimensional array on said pyroelectric element, the solder bumps having said relatively large size at portions of said substrate corresponding to corners of said two-dimensional array.

8. A pyroelectric infrared array sensor as claimed in claim 7, wherein said solder bumps have an intermediate size along a pair of opposite sides of said two-dimensional array.

9. A pyroelectric infrared array sensor, comprising:
    a pyroelectric element including a plurality of sensing sections each having an upper electrode and a lower electrode which confront each other through said pyroelectric element, for producing charges in response to heat generated by infrared rays applied thereto, said pyroelectric element having a light receiving surface;
    a substrate to which said pyroelectric element is fixedly secured, said substrate having a plurality of solder bumps which correspond to respective ones of said sensing sections;
    said solder bumps being connected to the lower electrodes of said respective sensing sections; and
    said solder bumps having a relatively large size at an outer portion of said substrate and having a relatively small size at an inner portion of said substrate;
    wherein said plurality of sensing sections are arranged in a two-dimensional array on said pyroelectric element, the solder bumps having said relatively large size at portions of said substrate corresponding to corners of said two-dimensional array; and wherein said solder bumps have an intermediate size along a pair of opposite sides of said two-dimensional array; and further comprising:

connecting conductors provided on said light receiving surface of said pyroelectric element for connecting said upper electrodes of said plurality of sensing sections to one another; and lead conductors provided on said light receiving surface of said pyroelectric element and extending from respective ones of said sensing sections which are located adjacent to edges of said light receiving surface, said lead conductors being connected to said substrate;

wherein said solder bumps disposed along sides of said two-dimensional array adjacent to said lead conductors also have said relatively small size.

* * * * *